United States Patent [19]
Nakamura et al.

[11] Patent Number: 5,263,184
[45] Date of Patent: Nov. 16, 1993

[54] NOISE REDUCING CIRCUIT FOR A RECEIVER USING A FUZZY CONTROLLER

[75] Inventors: Tetsuo Nakamura; Koichi Kasa; Toshihito Ichikawa; Masahide Terada, all of Saitama, Japan

[73] Assignee: Pioneer Electronic Corporation, Tokyo, Japan

[21] Appl. No.: 629,963

[22] Filed: Dec. 19, 1990

[30] Foreign Application Priority Data

Mar. 9, 1990 [JP] Japan .................. 2-056597

[51] Int. Cl.$^5$ .............................................. H04B 1/10
[52] U.S. Cl. .................. 455/220; 455/226.2; 455/226.3; 455/296; 395/3
[58] Field of Search .............. 455/296, 297, 222, 220, 455/226, 226.2, 226.3, 226.4; 381/10; 395/900, 3

[56] References Cited

U.S. PATENT DOCUMENTS

| | | | |
|---|---|---|---|
| 3,979,679 | 9/1976 | Bush et al. | 455/222 |
| 4,006,419 | 2/1977 | Liman | 455/222 |
| 4,833,715 | 5/1989 | Sakai | 381/17 |
| 4,864,490 | 9/1989 | Nomoto et al. | 395/3 |

FOREIGN PATENT DOCUMENTS

| | | |
|---|---|---|
| 0030874 | 6/1981 | European Pat. Off. . |
| 035716 | 2/1990 | European Pat. Off. . |
| 3721918 | 11/1988 | Fed. Rep. of Germany . |

OTHER PUBLICATIONS

Watanabe, "A VLSI Fuzzy Logic Controller with Reconfigurable, Cascadable Architecture" Apr. 1990 IEEE Journal of Solid State Circuits pp. 376–382.
Zadeh, "Fuzzy Logic", Apr. 1988, IEEE pp. 83–92.

*Primary Examiner*—Reinhard J. Eisenzopf
*Assistant Examiner*—Edward Urban
*Attorney, Agent, or Firm*—Sughrue, Mion, Zinn, Macpeak & Seas

[57] ABSTRACT

A noise reducing circuit for a receiver such as an FM receiver which is improved in noise reducing effect while reducing an unfamiliar feeling to and an erroneous operation of the receiver. The noise reducing circuit comprises fuzzy inference means for fuzzy inferring, using an input vector consisting of several factors defining a receiving input condition as a prerequisite, in accordance with fuzzy production rules provided by membership functions of the factors of the input vector, and a fuzzy controlling signal generating circuit for generating a fuzzy controlling signal for controlling a control object amount of any one of a separation control circuit, a frequency characteristic control circuit and muting circuit or each of any combination of the circuits in accordance with a result of inference produced by the fuzzy inference means.

8 Claims, 10 Drawing Sheets

NOISE REDUCING CIRCUIT FOR A RECEIVER USING A FUZZY CONTROLLER

BACKGROUND OF THE INVENTION

1. Field of the Invention

This invention relates to a noise reducing circuit for reducing noises of a receiver such as an FM receiver in accordance with fuzzy control of a control parameter of any of a frequency characteristic control circuit, a separation control circuit and a muting control circuit or of each of any combination of such circuits.

2. Description of the Prior Art

Generally, a receiving condition of a receiver is influenced significantly by receiving environment. Particularly in the case of an FM receiver, a receiving condition is varied greatly by multipath disturbance caused by geography of a circumferential place or by a difference in arrival time of reflected waves of linearly advancing waves due to the linearly advancing property of FM broadcasting waves.

In this manner, the reception electric field strength of a receiver is liable to be influenced by circumferential environment. The degree of such variation is higher with a receiver which is carried on a moving body such as an automobile because the surrounding environment is varied rapidly in accordance with movement of the moving body.

When a reception electric field strength and/or a mutipath condition are varied by a change of circumferential environment in this manner, the S/N ratio or the output of the receiver is varied. Thus, various inventions have been made for a car-carried receiver so that, even if the reception electric field strength and/or the multipath condition are varied by a variation of the surrounding environment, the S/N ratio or the output may not be varied. Particularly, since an FM stereo receiver presents a greater deterioration in sound quality caused by a deterioration of the S/N ratio upon dropping of a reception electric field strength value than an FM monaural receiver, special inventions have been made for FM stereo receivers.

FIG. 10 shows in block diagram an exemplary one of conventional car-carried FM stereo receivers. Referring to FIG. 10, in the FM stereo receiver shown, an FM stereo signal of a high frequency inputted from an antenna 21 is amplified and converted into an intermediate frequency (IF) signal by a front end section 22.

The IF signal is amplified by an IF amplifier 23 having a limiter function and then converted into an FM composite signal by an FM detecting circuit 24. The FM composite signal is amplified by an amplifier 25 and then passes through a muting control circuit 26, whereafter it is separated into left (L) and right (R) channel signals by a multiplex (MPX) demodulating circuit 27.

The left and right channel signals are supplied to a separation control circuit 28 for controlling a degree of separation of left and right channel signals and then pass through a frequency characteristic control circuit 29 for attenuating a high frequency level of left and right channel signals. Then, the left and right channel signals are outputted separately from the frequency characteristic control circuit 29, that is, from the FM stereo receiver.

Meanwhile, a level detecting circuit 31 of AM detection construction such as a so-called S meter detects a signal level of the IF amplifier 23 as a signal level which increases in proportion to a reception electric field strength value. The signal level thus detected is supplied to a pair of level setting circuits 32 and 33.

An output signal of the level setting circuit 32 is inputted to a control signal generating circuit 34, so that a control signal A corresponding to the TF signal level is produced from the control signal generating circuit 34. The control signal A causes the muting control circuit 26 to start its variable attenuating operation when the reception input level, that is, the reception electric field strength value, drops below a certain value, but when the reception input level further drops, the control signal A causes the attenuating amount of the muting controlling circuit 26 to be varied continuously in response to the reception input level.

A frequency displacement detecting circuit 35 instructs, when the input signal level is further dropped by a frequency displacement or the like and the output of the amplifying circuit 25 is dropped accordingly, the control signal generating circuit 34 to reduce the attenuating amount of the muting control circuit 26 infinitely to put the FM stereo receiver into a muted condition.

An output of the other level setting circuit 33 is inputted to a time constant circuit 36 at which a control signal B having suitably controlled rising and falling edge characteristics is produced. The frequency response of the frequency characteristic control circuit 29 is controlled in response to the control signal B.

Meanwhile, the control signal B is converted into a suitable level by a level controlling circuit 37 to make a separation degree adjusting signal C for the separation controlling circuit 28.

Referring now to FIG. 11, there are shown operation characteristics of of the FM stereo receiver. When the reception electric field strength value drops until the level detection value of the level detecting circuit 31 becomes lower than a first value $E_1$ (for example. 45 dB/$\mu$V or so) shown in FIG. 11, the separation control circuit 28 first starts its operation in response to a separation degree adjusting signal C generated by the level controlling circuit 37. Consequently, as the reception electric field strength value drops, the degree of stereo separation drops while such drop of the S/N ratio is reduced. In case the separation control circuit 37 starts its operation when the reception electric field strength value is 45 dB/$\mu$V or so, a monaural operation will be entered from a stereo operation at 25 dB/$\mu$V or so.

When the reception electric field strength value drops until the level detection value of the level detecting circuit 31 becomes lower than a second value $E_2$ (for example, 35 dB/$\mu$V or so) shown, the frequency characteristic control circuit 29 operates in response to a control signal B generated by the time constant circuit 36, and subsequently, the attenuation amount in a high frequency region increases as the reception electric field strength value drops. Consequently, while the high frequency characteristic of left and right channel signals drops as the reception electric field strength value drops, the drop of the S/N ratio is reduced. In case the frequency characteristic control circuit 29 operates when the reception electric field value is 35 dB/$\mu$V or so, frequency characteristic control for a high frequency region up to 15 dB/$\mu$V or so is performed.

When the reception electric field strength value further drops until the level detection value of the level detecting circuit 31 becomes lower than a third value $E_3$ (for example, 25 dB/$\mu$V or so) shown, the muting control circuit 26 operates in response to a control signal A generated by the control signal generating circuit 34, and subsequently, the attenuation amount of left and right channel signals is continuously increased as the reception electric field strength value drops. Consequently, while the output level of left and right channel signals drops as the reception electric field strength value drops, increase of the noise level is reduced.

When the reception electric field strength value further drops until the level detection value of the level detecting circuit 31 becomes lower than a fourth value $E_4$ (for example, 15 dB/$\mu$V or so) shown, the control signal generating circuit 34 operates in response to a control signal generated by the frequency displacement detecting circuit 35 so that the attenuation amount of the muting control circuit 26 becomes infinite to put the FM stereo receiver into a muted condition.

Thus, when the receiving input level, that is, the detection value of the reception electric field strength value, becomes lower than the first value, separation of left and right channel signals is varied continuously, and when the detection value becomes lower than the first value $E_1$ and further lower than the second value $E_2$ within a separation control range, the frequency characteristic with regard to a reproduction signal is varied continuously, and further, when the detection value becomes lower than the second value $E_2$ and further lower than the third value $E_3$ around a monaural operation mode by separation control, the reproduction signal revel is varied continuously.

Since the characteristics of the separation control circuit 28, frequency characteristic control circuit 29 and muting control circuit 26 are varied continuously from operation starting points of the individual circuits as the reception input level, that is, the reception electric field strength value, drops in this manner, a substantially constant S/N ratio can be assured and the noise level can be reduced independently of a magnitude of the reception electric field strength value as indicated by a broken line curve in FIG. 11.

Meanwhile, since a good S/N ratio and noise level are assured irrespective of a magnitude of the reception electric field strength value and the characteristics of the individual circuits are controlled continuously, even if the reception electric field strength value varies, an output signal of the FM stereo receiver will not vary suddenly, and it is possible to eliminate an unfamiliar feeling to a variation of the output signal of the FM stereo receiver.

As can be understood from the foregoing description of the controlling system of characteristics of the individual circuits in the FM stereo receiver, separation control, frequency characteristic control and muting control in a conventional FM receiver are of the nature that part of a signal received is omitted or processed in principle. Consequently, improvement in noise reduction effect and improvement in reduction effect of an unfamiliar feeling and an erroneous operation thereof have a mutually antinomic relationship. This similarly applies to a pulse noise suppressing system for removing external pulse noises.

Due to such circumstances, in a conventional noise reducing system for an FM receiver, control characteristics of individual control circuits are selectively determined while setting the point of compromise between a noise reducing effect and a reducing effect of an unfamiliar feeling and an erroneous operation uniformly.

By the way, for example, the multipath amount may be great or small with an equal detection value of the reception electric field strength. In such instance, it is possible to realize further good controls by setting control values of the individual control circuits individually in accordance with a relationship in magnitude of multipath amounts. This similarly applies to any other amount which defines a receiving condition.

In particular, it is possible to reconcile improvement in pulse noise reducing effect and a reducing effect of an unfamiliar feeling and an erroneous operation in high dimensions with each other in accordance with a receiving input condition by individually controlling control object amounts of individual control circuits in response to magnitudes of levels of individual factors which define such receiving input condition as described above.

However, in a conventional receiver, control parameters such as controlling time constants, controlling operation starting voltages, controlling amounts and so forth of the individual control circuits are set uniformly without taking contents of individual factors defining a receiving input condition into consideration. Consequently, it is not possible to variably set controlling conditions of the individual control circuits individually in accordance with conditions of receiving circumstances, and there is a disadvantage that it is difficult to realize it to make improvement in pulse noise reducing effect and a reducing effect in unfamiliar feeling and erroneous operation in accordance with contents of individual factors defining a receiving input condition.

SUMMARY OF THE INVENTION

It is an object of the present invention to provide a noise reducing circuit for a receiver which is improved in noise reducing effect while reducing an unfamiliar feeling to and an erroneous operation of the receiver.

In recent year, use of a technique of control called fuzzy control has been gradually increased in the technical field of control. In such fuzzy control, degrees at which observed values match a plurality of input conditions including fuzzy expressions are determined individually, and control parameters which are considered the best are inferred taking such matching degrees synthetically.

Meanwhile, any of relationships in magnitude among various factors such as reception electric field strength values, multipath amounts and so forth which define a receiving input condition is not determined objectively nor decisively and is a fuzzy expression. For example, even if it is expressed that a reception electric field strength value is high, a degree at which a certain observed reception electric field strength value matches a condition that "a reception electric field strength value is high" is very fuzzy.

Accordingly, in case relationships in magnitude of different factors defining a receiving input condition are provided by fuzzy expressions of characteristics, it is possible to individually cope with contents of individual factors defining a receiving input condition to realize setting of good control amounts taking them into consideration synthetically.

According to the present invention, taking characteristics of such fuzzy control into consideration, control parameters of individual control circuits of an FM receiver are fuzzy controlled to individually cope with observed values of individual factors defining a reception input condition of the receiver to make improvement in pulse noise reducing effect and a reducing effect in unfamiliar feeling and erroneous operation consistent with each other.

In particular, in order to attain the object described above, according to the present invention, there is provided a noise reducing circuit for a receiver which includes at least one of a frequency characteristic control circuit, a separation control circuit and a muting control circuit, which comprises an input vector generating circuit for detecting values of different factors which define a receiving input condition of the receiver and generating an input vector which includes the values as factors thereof, fuzzy inference means for fuzzy inferring, using the input vector from the input vector generating circuit as a prerequisite, in accordance with fuzzy production rules provided by membership functions of the factors of the input vector, and a fuzzy controlling signal generating circuit for generating a fuzzy controlling signal for controlling a control parameter of any one of the separation control circuit, frequency characteristic control circuit and muting control circuit or each of any combination of the circuits in accordance with a result of inference produced by the fuzzy inference means.

With the noise reducing circuit, a control parameter of any of the control circuits of the receiver or each of any combination of such control circuits, values of the control parameters of the control circuits are controlled individually in accordance with observed values of the factors defining a receiving input condition. Accordingly, improvement in pulse noise reducing effect and a reducing effect in unfamiliar feeling and erroneous operation can be made consistent well in accordance with observed values of a condition of receiving environment.

The above and other objects, features and advantages of the present invention will become apparent from the following description and the appended claims, taken in conjunction with the accompanying drawings.

DESCRIPTION OF THE PREFERRED EMBODIMENTS

Figure 1:
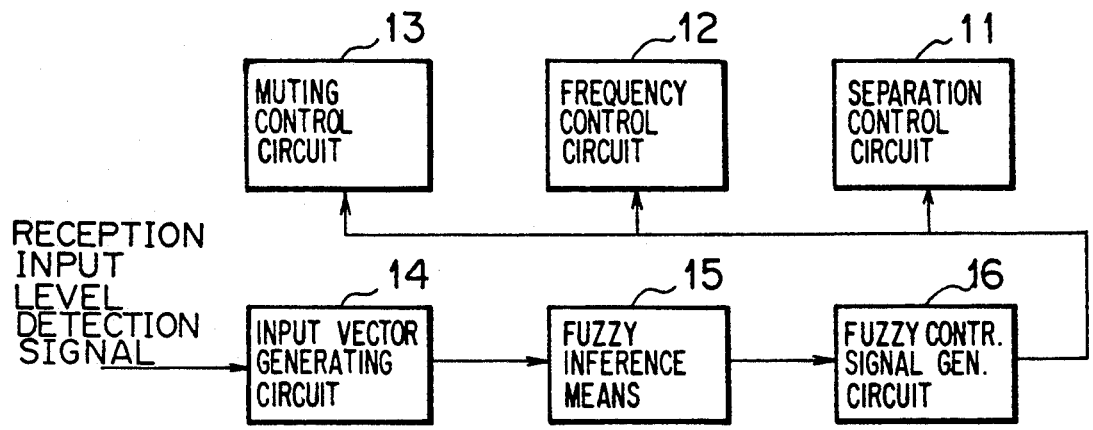
FIG. 1 is a block diagram showing basic construction of a noise reducing circuit according to the present invention.

Referring first to FIG. 1, there is shown a basic construction of a noise reducing circuit according to the present invention. The noise reducing circuit is incorporated in a receiver such as an AM receiver. The receiver includes a separation control circuit 11 for controlling a degree of separation of left and right channel signals of a stereo signal, a frequency control circuit 12 for controlling a frequency characteristic of an output signal, and a muting control circuit 13 for variably attenuating an output signal to effect muting control.

The noise reducing circuit according to the present invention is connected to the separation control circuit 11, frequency control circuit 12 and muting control circuit 13 of the receiver and includes an input vector generating circuit 14 for detecting values of individual factors which define a receiving input condition and generating an input vector in accordance with such detected values. The noise reducing circuit further includes fuzzy inference means 15 which receives an input vector from the input vector generating circuit 14 and executes, using the input vector as a prerequisite, fuzzy inference in accordance with fuzzy production rules provided in the form of membership functions of different factors of the input vector. The noise reducing circuit further includes a fuzzy controlling signal generating circuit 16 which receives a result of inference produced by the fuzzy inference means 15 and generates, in accordance with the thus received inference result, fuzzy controlling signals for controlling the control parameters of any of the separation controlling circuit 11, frequency characteristic controlling circuit 12 and muting circuit 13 or each of any combination of the circuits 11, 12 and 13.

In operation, the receiver in which the noise reducing circuit of the present invention is incorporated detects values of several factors such as a reception electric field strength and a multipath amount which define a receiving condition as described hereinabove in connection with the conventional FM receiver. The thus detected values are inputted to the input vector generating circuit 14. In response to the values thus received, the input vector generating circuit 14 generates an input vector which includes the values as factors thereof and transmits it to the fuzzy inference means 15.

Figure 2:
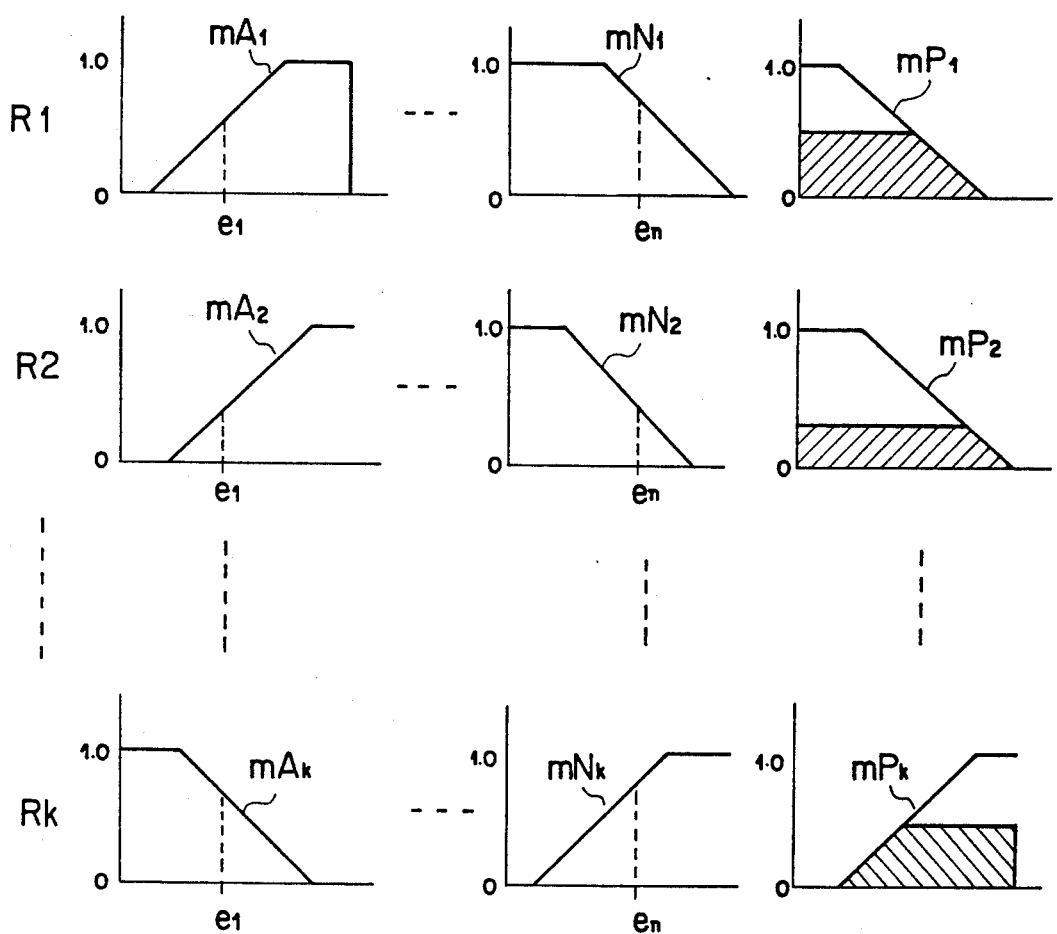
FIG. 2 shows a set of diagrams illustrating fuzzy inference processing of the noise reducing circuit shown in FIG. 1.

The fuzzy inference means 15 executes such fuzzy inference processing as illustrated in FIG. 2 in accordance with fuzzy production rules provided in the form of membership functions with regard to individual factors of the input vector to produce a fuzzy controlling signal.

Referring to FIG. 2, graphs $mA_1$ to $mN_1$ illustrate membership functions with regard to input vector factors $e_1$ to $e_n$ based on a precedent portion of a fuzzy production rule R1, respectively, while graphs $mA_k$ to $mN_k$ illustrate membership functions with regard to the input vector factors $e_1$ to $e_n$ based on a precedent portion of a fuzzy production rule Rk. respectively. Meanwhile, graphs $mP_1$ to $mP_k$ illustrate membership functions with regard to results (consequent portions) of the fuzzy production rules R1 to Rk, respectively. The individual membership functions are theoretically or experimentally determined in advance for the input vectors $e_1$ to $e_n$ and individual fuzzy production rules.

The fuzzy inference means 15 executes fuzzy inference for the individual input vector factors $e_1$ to $e_n$ in accordance with the individual membership functions of the precedents of the corresponding fuzzy production rules R1 to Rk to first determine results of inference with regard to the individual membership functions $mP_1$ to $mP_k$ (hatched regions of the individual membership functions $mP_1$ to $mP_k$). A particular method of determining individual results of inference will be hereinafter described in detail.

Subsequently, the fuzzy inference means 15 determines a final inference result F using a method of elastic center, a MIN-MAX method or the like in accordance with the results of fuzzy inference. As a result of the inference processing, the value of the final inference result F decreases as the reception electric field strength value E increases and the multipath amount detection value P decreases, that is, as the receiving condition becomes better, and on the contrary the value of the final inference result F increases as the reception electric field strength value E decreases and the multipass amount detection value P increases, that is, as the receiving condition becomes worse. Details of the method of determining such final inference result F will be hereinafter described.

The fuzzy controlling signal generating circuit 16 receives such inference result F produced by the fuzzy inference means 15 and generates a fuzzy controlling signal in accordance with the received inference result F to fuzzy control a control parameter of any of the separation control circuit 11, frequency characteristic control circuit 12 and muting circuit 13 or each of a combination of the circuits 11, 12 and 13. The control parameter may be a time constant, a controlling operation starting point, a controlling amount or the like of any of the control circuits.

Since values of control parameters of the control circuits are controlled in accordance with a receiving input condition by fuzzy controlling the separation control circuit 11, frequency characteristic control circuit 12 and muting circuit 13 in this manner, improvement in noise reducing effect and a reducing effect in unfamiliar feeling and erroneous operation can be made consistent with each other well individually in accordance with a receiving condition. Details of such control will be hereinafter described.

Since a control parameter of any of the separation control circuit 11, frequency characteristic control circuit 12 and muting circuit 13 or each of a combination of the circuits 11, 12 and 13 is fuzzy controlled as described so far, the control parameters of the control circuits 11, 12 and 13 are controlled individually in accordance with observed values of factors defining a receiving input condition, and improvement in noise reducing effect and a reducing effect in unfamiliar feeling and erroneous operation can be made consistent with each other well individually in accordance with observed values of conditions of receiving environment.

First Embodiment

A first embodiment of the present invention will be described below with reference to FIGS. 3 to 5. In the present embodiment, the control parameter is a controlling time constant of each control circuit. Meanwhile, the number of factors of an input vector is two including a reception electric field strength value E and a multipath amount detection value P, and the fuzzy production rules are two rules of R11 and R21.

(A) Generation of Input Vector

Figure 3A:
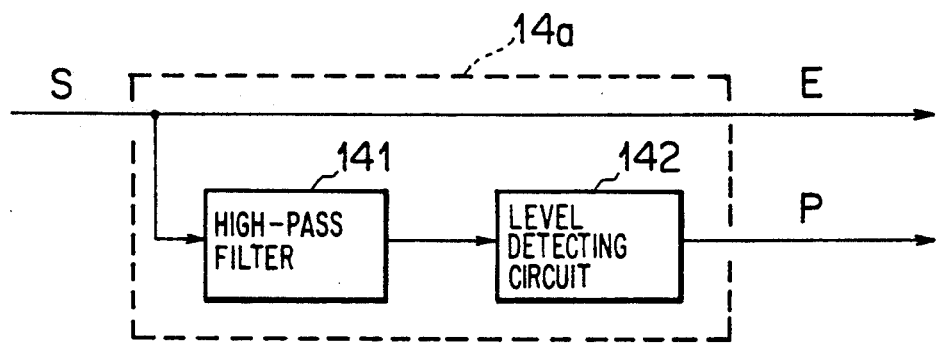
FIGS. 3a and 3b are block diagrams showing input vector generating circuits for generating a reception electric field strength value and a multipath amount detection value, respectively, of a noise reducing circuit according to a first embodiment of the present invention.
Figure 3B:
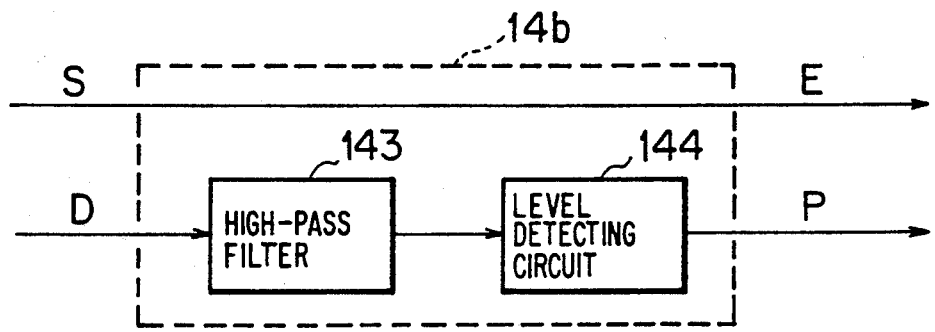

FIG. 3a and 3b show input vector generating circuits 14a and 14b for generating a reception electric field strength value E and a multipath amount detection value P, respectively, which are factors of an input vector.

Referring first to FIG. 3a, inputted to the input vector generating circuit 14a is a level detection signal S which may be generated by a level detecting circuit such as the level detecting circuit in the form of an S meter mentioned hereinabove with reference to FIG. 10. A multipath amount is included in ac components of the level detection signal S.

The input vector generating circuit 14a divides the inputted level detection signal S into two portions and outputs one of the two portions as a reception electric field strength value E.

Meanwhile, the other portion of the level detection signal S is supplied to a high-pass filter 141 by which ac components of the same are extracted. A level detecting circuit 142 detects a level of the ac components by AM detection and outputs it as a multipath amount detection value P.

Figure 10:
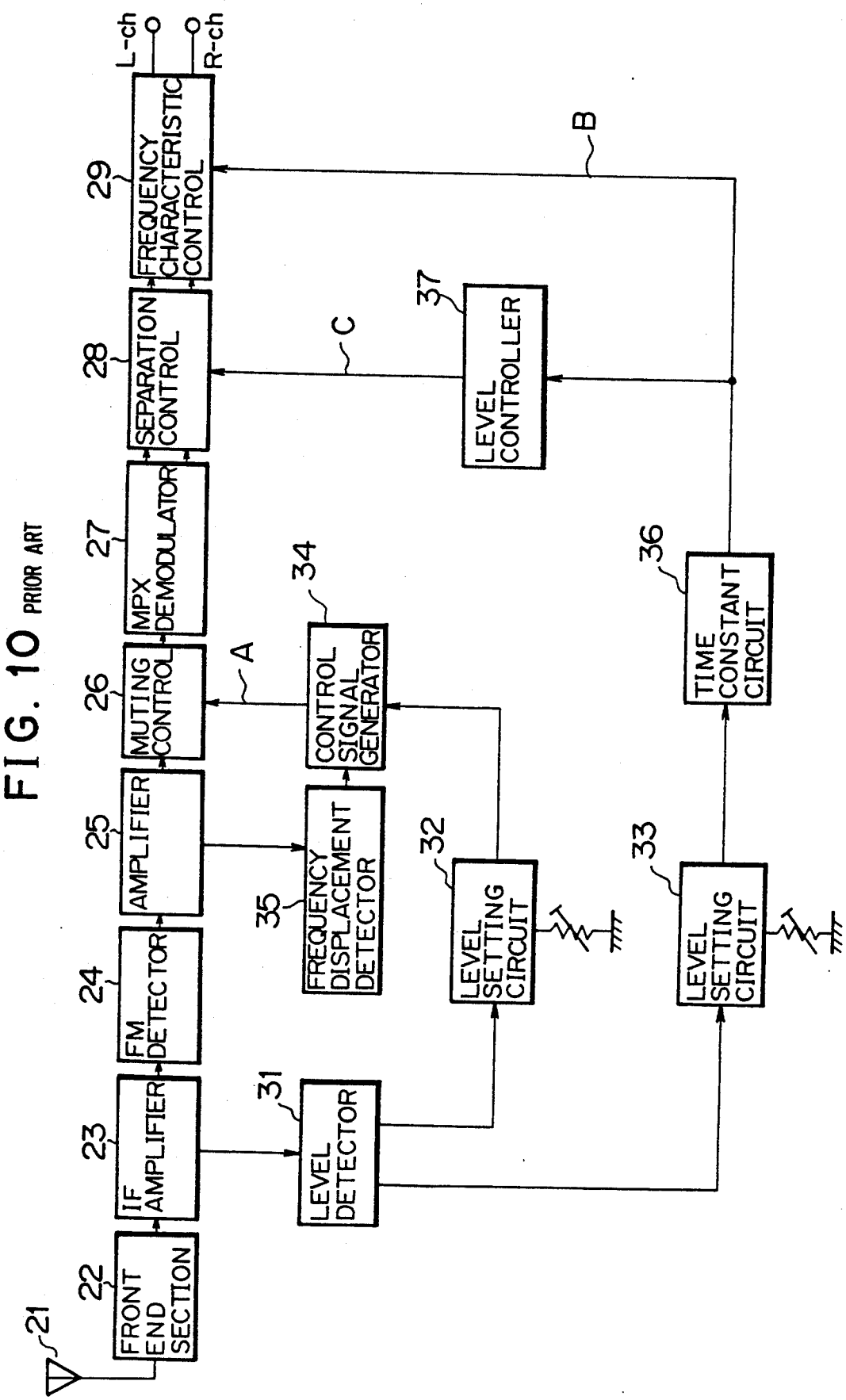
FIG. 10 is a block diagram showing general construction of a conventional FM receiver.
Figure 11:
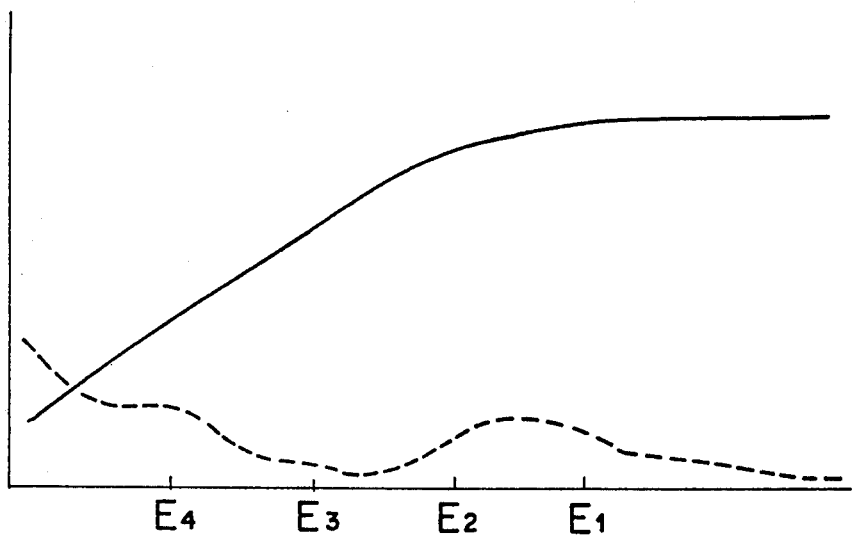
FIG. 11 is a diagram illustrating of operation of the FM receiver shown in FIG. 10.

Referring now to FIG. 3b, a detection signal D generated by a receiving signal detecting circuit such as the FM detecting circuit 24 described with reference to FIG. 10 is supplied directly or by way of an amplifying circuit such as the amplifying circuit 25 of FIG. 10 to the input vector generating circuit 14b together with the level detection signal S. A multipath amount is included in ac components of the detection signal D.

The input vector generating circuit 14b outputs the inputted level detection signal S as a reception electric field strength value E which is one of factors of an input vector.

Meanwhile, the detection signal D is supplied to a high-pass filter 143 by which ac components thereof are extracted. A level detecting circuit 144 detects a level of the ac components by AM detection and outputs it as a multipath amount detection value P which is another factor of the input vector.

(B) Fuzzy Inference Processing

Fuzzy inference processing of the noise reducing circuit of the first embodiment is executed by the fuzzy inference means 15. In the fuzzy inference processing, the following two fuzzy production rules R11 and R21 and membership functions which provide the fuzzy production rules R11 and R21 are set. The fuzzy production rules and membership functions are theoretically or experimentally set so that a good receiving condition may be obtained in accordance with a reception electric field strength value E and a multipass amount P.

(1) Fuzzy Production Rule R11

(1) Prerequisite (IF):

$a_{11}$: A receiving electric field level is high.

$b_{11}$: A multipath amount is small.

(2) Result (Consequent Portion, THEN):

A controlling time constant is decreased.

(2) Membership Functions of Fuzzy Production Rule R11

Figure 4:
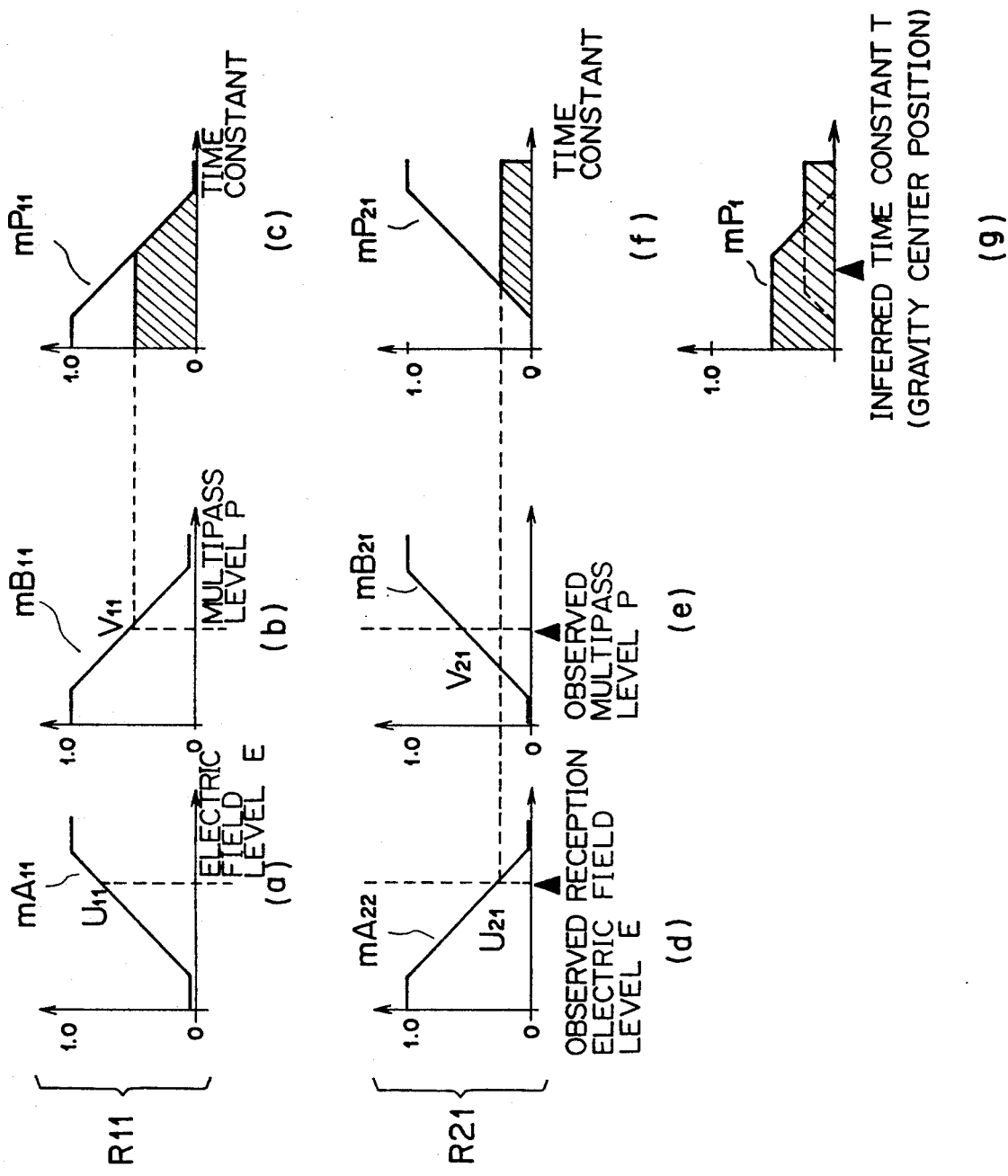
FIG. 4 shows a set of diagrams illustrating fuzzy inference processing of the noise reducing circuit of the first embodiment.
Figure 5:
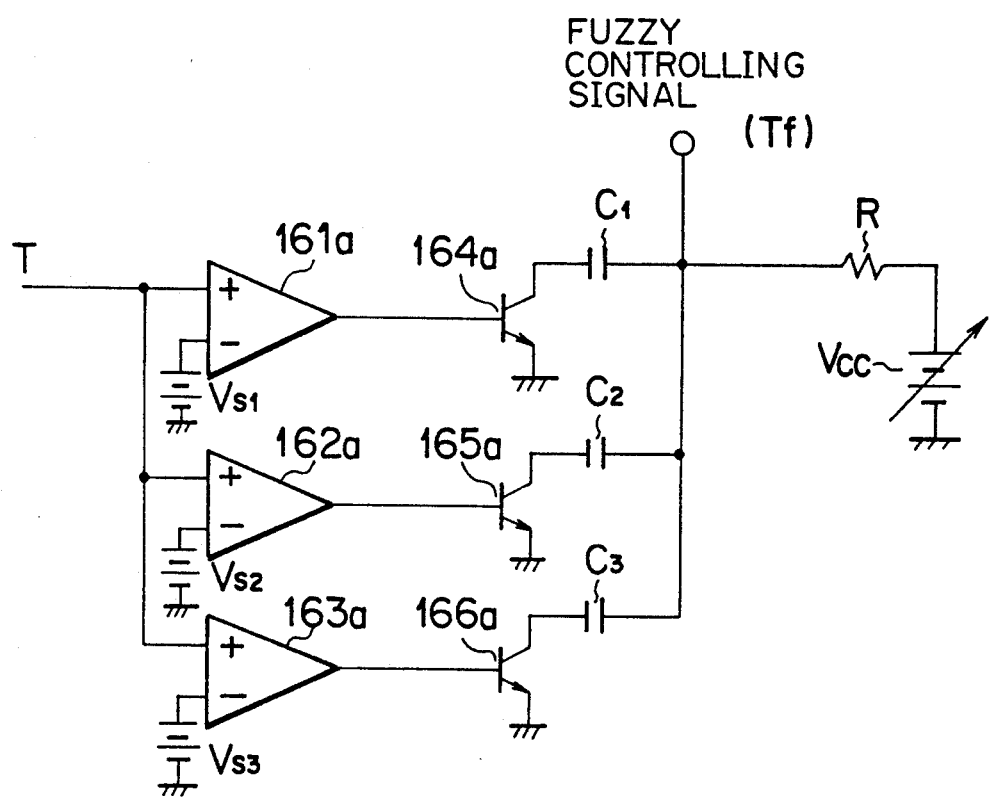
FIG. 5 is a circuit diagram of a fuzzy controlling signal generating circuit of the noise reducing circuit of the first embodiment.

(1) Membership Function $mA_{11}$ of Prerequisite $a_{11}$:

A diagram (a) of FIG. 4 illustrates a membership function $mA_{11}$ which provides a prerequisite $a_{11}$, that is, probability of highness of a reception electric field level.

In the diagram of the membership function $mA_{11}$, the axis of abscissa indicates a reception electric field strength E and the axis of ordinate indicates a degree at which the prerequisite $a_{11}$ is matched. The value of the degree when the prerequisite $a_{11}$ is matched thoroughly is 1, and the value of the degree when the prerequisite $a_{11}$ is not matched at all is 0. The diagram (a) indicates that the degree at which the prerequisite $a_{11}$ is matched increases as the reception electric field strength E increases.

(2) Membership Function $mB_{11}$ of Prerequisite $b_{11}$:

A diagram (b) of FIG. 4 illustrates a membership function $mB_{11}$ which provides a prerequisite $b_{11}$, that is, probability of smallness of a multipath amount.

In the diagram (b) of the membership function $mB_{11}$, the axis of abscissa indicates a multipath amount P and the axis of ordinate indicates a degree at which the prerequisite $b_{11}$ is matched. The value of the degree when the prerequisite $b_{11}$ is matched thoroughly is 1, and the degree when the prerequisite $b_{11}$ is not matched at all is 0. The diagram (b) indicates that the degree at which the prerequisite $b_{11}$ is matched decreases as the multipath amount detection value P increases.

(3) Membership Function $mP_{11}$ Providing Result:

A diagram (c) of FIG. 4 indicates a membership function $mB_{11}$ which provides a result, that is, a controlling time constant.

In the diagram (c) of the membership function $mP_{11}$, the axis of abscissa indicates a controlling time constant T and the axis of ordinate indicates a degree at which the result is matched. The value of the degree when the result is matched thoroughly is 1, and the degree when the result is not matched at all is 0. The diagram (c) indicates that the degree at which the result is matched decreases as the controlling time constant T increases.

(3) Fuzzy Production Rule R21

(1) Prerequisite (IF): $a_{21}$: A reception electric field level is low.

$b_{21}$: A multipath amount is great.

(2) Result (Consequent Portion, THEN):

A controlling time constant is increased.

(4) Membership Functions of Fuzzy Production Rule R21

(1) Membership Function $mA_{21}$ of Prerequisite $a_{21}$:

A diagram (d) of FIG. 4 illustrates a membership function $mA_{21}$ which provides a prerequisite $a_{21}$, that is, probability of lowness of a reception electric field level.

While contents of the membership function $mA_{21}$ are similar to those of the membership function $mA_{11}$, it can be seen that, contrary to the membership function $mA_{11}$, the degree at which the prerequisite $a_{21}$ is matched decreases as the reception electric field strength E increases.

(2) Membership Function $mB_{21}$ of Prerequisite $b_{21}$:

A diagram (e) of FIG. 4 illustrates a membership function $mB_{21}$ which provides a prerequisite $b_{21}$, that is, probability of greatness of a multipath amount.

While contents of the membership function $mB_{21}$ are similar to those of the membership function $mB_{11}$, it can be seen that, contrary to the membership function $mB_{11}$, the degree at which the prerequisite $b_{21}$ is matched increases as the multipath amount detection value P increases.

(3) Membership Function $mP_{21}$ Providing Result:

A diagram (f) of FIG. 4 illustrates a membership function $mP_{21}$ which provides a result, that is, a controlling time constant.

While contents of the membership function $mP_{21}$ are similar to those of the membership function $mP_{11}$, it can be seen that, contrary to the membership function $mP_{11}$, the degree at which the result is satisfied increases as the controlling time constant T increases.

(5) Fuzzy Inference Processing

Fuzzy inference processing which is executed by the fuzzy inference means 15 will be described in accordance with an inference procedure thereof.

(1) Values of the membership functions $mA_{11}$ and $mA_{21}$ with regard to a reception electric field strength E of an input vector are determined, and values of $u_{11}$ and $u_{21}$ are determined from the diagrams (a) and (d) of FIG. 4, respectively.

(2) Values of the membership functions $mB_{11}$ and $mB_{21}$ with regard to a multipath amount detection value P of the input vector are determined, and values of $v_{11}$ and $v_{21}$ are determined from the diagrams (b) and (e) of FIG. 4, respectively.

(3) Inference processing according to the fuzzy production rule R11 is executed first.

While various methods are available of determining, from values of the individual membership functions corresponding to the observed reception electric field strength E and multipath amount detection value P, a degree at which the membership function $mA_{11}$ and the membership function $mB_{11}$ match (soft matching) the fuzzy production rule R11, a minimum value method is employed in the present embodiment.

According to the minimum value method, a minimum value among degree values with respect to the input vector of the membership functions which provide the fuzzy production rules is selected as a value of the degree at which the membership functions match the fuzzy production rule R1.

Since the relationship in magnitude between the values $u_{11}$ and $v_{11}$ of the membership functions $mA_{11}$ and $mB_{11}$ corresponding to the observed reception electric field strength E and multipath amount detection value P is $u_{11} > v_{11}$, $v_{11}$ is selected, by the minimum value method, as a value at which the membership functions $mA_{11}$ and $mB_{11}$ match the fuzzy production rule R11.

Since the value of the degree at which the fuzzy production rule R11 is matched is $v_{11}$, the membership function $mP_{11}$ which provides a result of inference in accordance with the fuzzy production rule R11 is represented by a region lower than $v_1$ as indicated by hatching lines in the diagram (c) of FIG. 4 in accordance with the head cutting method of Yager.

(4) Subsequently, inference processing in accordance with the fuzzy production rule R21 is executed.

Similarly as in the case of the fuzzy production rule R11, since the relationship in magnitude between values $u_{21}$ and $v_{21}$ of the membership functions $mA_{21}$ and $mB_{21}$ corresponding to the observed reception electric field strength E and multipass amount detection value P is $u_{21} < v_{21}$, $u_{21}$ is selected, by the minimum value method, as a value at which the membership functions $mA_{21}$ and $mB_{21}$ match the fuzzy production rule R21.

Since the value of the degree at which the fuzzy production rule R21 is matched is $u_{21}$, the membership function $mP_{21}$ which provides a result of inference in accordance with the fuzzy production rule R21 is represented by a region lower than $u_2$ as indicated by hatching lines in a diagram (f) of FIG. 4 in accordance with the head cutting method of Yager.

(5) While various methods are available also of obtaining a final result of inference in accordance with the results of the inferences (3) and (4) obtained in accordance with the fuzzy production rules R11 and R21, the method of elastic center is employed in the present embodiment.

According to the method of elastic center, the membership functions $mP_{11}$ and $mP_{12}$ shown in the diagrams (c) and (f) of FIG. 4 (hatched regions) are first overlapped with each other in accordance with a MAX composing method to compose a composite membership function $mP_1$ as shown in a diagram (g) of FIG. 4.

Subsequently, a coordinate value T on the axis of abscissa of the center of gravity of the composite membership function $mP_1$ is outputted as a final inference result, that is, a controlling time constant value T.

By the inference processing described so far, the value of the controlling time constant T which is a final inference result increases as the reception electric field strength value E increases and the multipath mount detection value P decreases, that is, as the receiving condition becomes better, and on the contrary, as the reception electric field strength value E decreases and the multipath amount detection value P increases, that is, as the receiving condition becomes worse, the value of the controlling time constant T which is a final inference result decreases.

(C) Fuzzy Controlling Operation

Construction and fuzzy controlling operation of a controlling signal generating circuit which is included in the noise reducing circuit of the first embodiment will be described with reference to FIG. 5.

The controlling signal generating circuit shown includes three comparators $161a$ to $163a$ for comparing a controlling time constant value T of a final inference result from the fuzzy inference means 15 with reference voltages $V_{s1}$, $V_{s2}$ and $V_{s3}$, respectively. The relationship in magnitude of the reference voltages $V_{s1}$, $V_{s2}$ and $V_{s3}$ is set as $V_{s1} < V_{s2} < V_{s3}$.

The comparators $161a$ to $163a$ are connected to the bases of switching transistors $164a$, $165a$ and $166a$, respectively, so that each of the switching transistors $164a$ to $166a$ is turned on into a conducting state in response to an output generated by a corresponding one of the comparators $161a$ to $163a$.

Capacitors $C_1$, $C_2$ and $C_3$ are connected at one end to the collectors of the switching transistors $164a$ to $166a$, respectively, and at the other ends commonly to a resistor R. The capacitors $C_1$ to $C_3$ and resistor R constitute a time constant circuit, and a fuzzy controlling signal is outputted from the common connecting point of the capacitors $C_1$ to $C_3$ and resistor R. A power source voltage is obtained from a power source battery Vcc connected to the other end of the resistor R.

In the controlling signal generating circuit, the comparators $161a$ to $163a$ compare the controlling time constant value T of a final inference result from the fuzzy inference means 15 with the reference voltages $V_{s1}$ to $V_{s3}$ and each generate an output signal when the controlling time constant value T is higher than the reference voltage $V_{s1}$, $V_{s2}$ or $V_{s3}$, respectively.

In the case of the reference voltage $V_{s3} <$ reference voltage $V_{s2} <$ controlling time constant value $T <$ reference voltage $V_{s1}$, only the switching transistor $164a$ is conducting, and the time constant of a fuzzy controlling signal to be outputted is defined by $C_1 R$.

In the case of the reference voltage $V_{s3} <$ controlling time constant value $T <$ reference voltage $V_{s2} <$ reference voltage $V_{s1}$, the switching transistors $164a$ and $165a$ are conducting, and the time constant of a fuzzy controlling signal to be outputted is defined by $(C_1 + C_2) R$.

In the case of the controlling time constant value $T <$ reference voltage $V_{s3} <$ reference voltage $V_{s2} <$ reference voltage $V_{s1}$, the switching transistors $164a$, $165a$ and $166a$ are all conducting, and the time constant of a fuzzy controlling signal to be outputted is defined by $(C_1 + C_2 + C_3) R$.

If the time constants of the individual control circuits are controlled using the controlling time constant value Tf obtained in such a manner as described above as a fuzzy controlling signal, then since the value of the controlling time constant Tf increases as the reception electric field strength value E increases and the multipath amount detection value P decreases, that is, as the receiving condition becomes better, the individual control circuits do not respond very much to a temporary change of the receiving input condition and maintains the good receiving condition also after then.

On the contrary, since the value of the controlling time constant T which is a final inference result decreases and the controlling time constant Tf of a fuzzy controlling signal decreases as the reception electric field strength value E decreases and the multipath amount detection value P increases, that is, as the receiving condition becomes worse, the individual control circuits respond quickly to a change of the receiving input condition and can prevent the receiving condition from getting worse.

Second Embodiment

A second embodiment of the present embodiment will be described with reference to FIGS. 3a, 3b, 6 and 7. The input vector generating circuits shown in FIGS. 3a and 3b are used also as an input vector generating circuit of a noise reducing circuit of the present embodiment.

In the second embodiment described subsequently, the control parameter is a controlling operation starting point of each control circuit. Meanwhile, the number of factors of an input vector is two including a reception electric field strength value E and a multipath amount detection value P similarly as in the case of the first embodiment, and fuzzy production rules are two rules of R12 and R22.

(A) Generation of Input vector

Since construction of the input vector generating circuits 14a and 14b shown in FIGS. 3a and 3b, respectively, and operation of the input vector generating circuits 14a and 14b to generate a reception electric field strength value E and a multipath amount detection value P are described hereinabove, overlapping description thereof will be omitted to avoid redundancy.

(B) Fuzzy Inference Processing

Fuzzy inference processing executed by the fuzzy inference means 15 will be described with reference to FIG. 6.

In fuzzy inference processing in the noise reducing circuit of the second embodiment, the following two fuzzy production rules R12 and R22 as well as membership functions which provide the fuzzy production rules R12 and R22 are set. Also here, the fuzzy production rules and membership functions are theoretically or experimentally set so that a good receiving condition may be obtained in accordance with a reception electric field strength value E and a multipath amount detection value P.

(1) Fuzzy Production Rule R12

(1) Prerequisite (IF):

$a_{12}$: A reception electric field level is high.

$b_{12}$: A multipath amount is small.

(2) Result (Consequent Portion, THEN):

A controlling operation point is made higher (controlling operation of the individual controlling circuits becomes more difficult as the controlling operation starting point is made higher).

(2) Membership Functions of Fuzzy Production Rule R12

Figure 6:
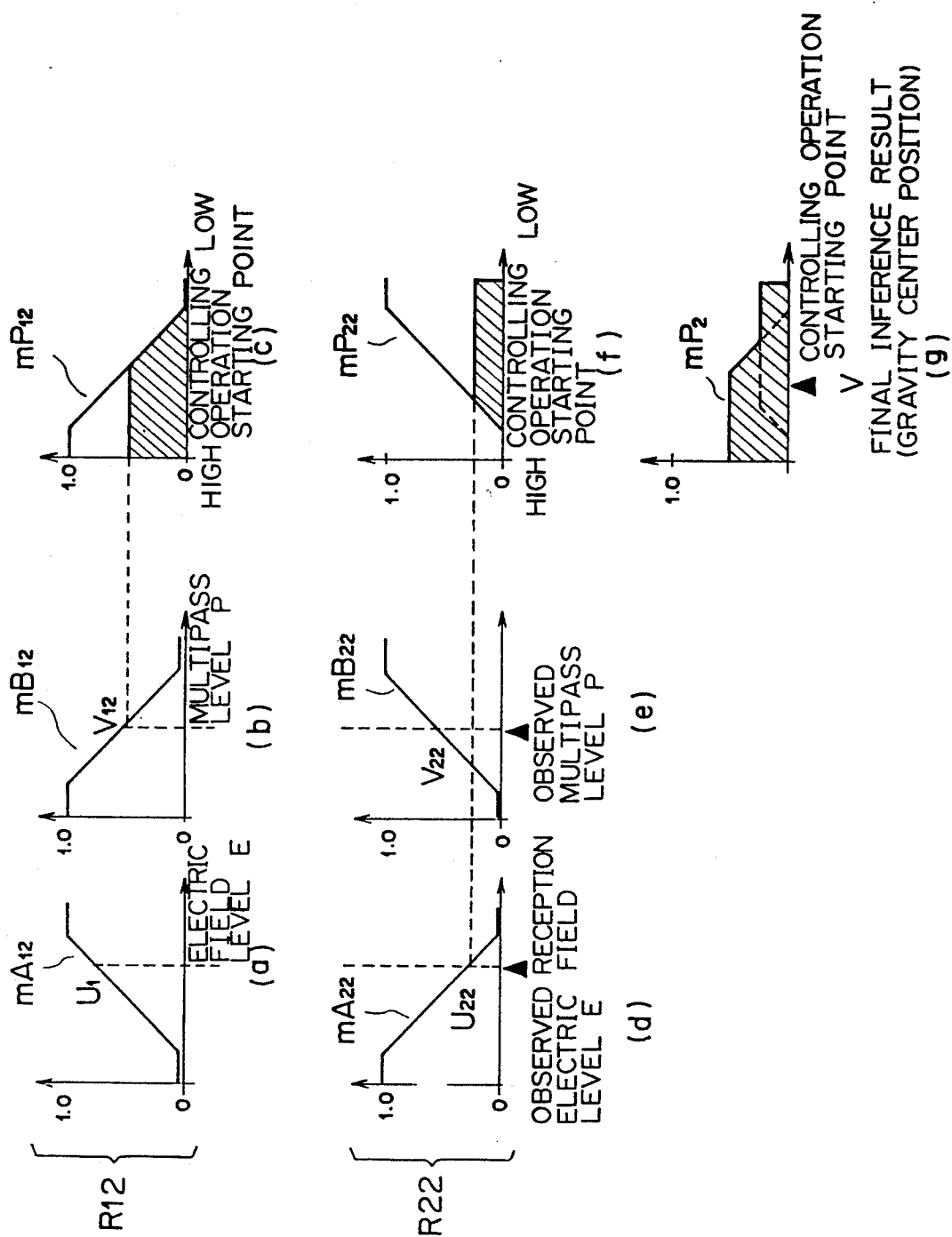
FIG. 6 shows a set of diagrams illustrating fuzzy inference processing of a noise reducing circuit according to a second embodiment of the present invention.

(1) Membership Function $mA_{12}$ of Prerequisite $a_{12}$:

A diagram (a) of FIG. 6 illustrates a membership function $mA_{12}$ which provides a prerequisite $a_{12}$, that is, probability of highness of a reception electric field level.

Contents of the membership function $mA_{12}$ are similar to those of the membership function $mA_{11}$ shown in the diagram (a) of FIG. 4, and it can be seen that the degree at which the prerequisite $a_{12}$ is matched increases as the reception electric field strength E increases.

(2) Membership Function $mB_{12}$ of Prerequisite $b_{12}$:

A diagram (b) of FIG. 6 illustrates a membership function $mB_{12}$ which provides a prerequisite $b_{12}$, that is, probability of smallness of a multipath amount.

Contents of the membership function $mB_{12}$ are similar to those of the membership function $mB_{11}$ shown in the diagram (b) of FIG. 4, and it can be seen that the degree at which the prerequisite $b_{12}$ is matched decreases as the multipath amount detection value P increases.

(3) Membership Function $mP_{12}$ Providing Result:

A diagram (c) of FIG. 6 illustrates a membership function $mP_{12}$ which provides a result, that is, a controlling operation starting point.

Contents of the membership function $mP_{12}$ are similar to those of the membership function $mP_{11}$ shown in the diagram (c) of FIG. 4, and it can be seen that the degree at which the result is matched decreases as the controlling operation point V becomes higher.

(3) Fuzzy Production Rule R22

(1) Prerequisite (IF):

$a_{22}$: A reception electric field level is low.

$b_{22}$: A multipath amount is great.

(2) Result (Consequent Portion, THEN):

A controlling operation point is made lower (controlling operation of the individual controlling circuits becomes easier as the controlling operation starting point becomes lower).

(4) Membership Functions of Fuzzy Production Rule R22

(1) Membership Function $mA_{22}$ of Prerequisite $a_{22}$:

A diagram (d) of FIG. 6 illustrates a membership function $mA_{22}$ which provides a prerequisite $a_{22}$, that is, probability of lowness of a reception electric field level.

While contents of the membership function $mA_{22}$ are similar to those of the membership function $mA_{12}$, it can be seen that, contrary to the membership function $mA_{12}$, the degree at which the prerequisite $a_{22}$ is matched decreases as the reception electric field strength E increases.

(2) Membership Function $mB_{22}$ of Prerequisite $b_{22}$:

A diagram (e) of FIG. 6 illustrates a membership function $mB_{22}$ which provides a prerequisite $b_{22}$, that is, probability of greatness of a multipass amount.

While contents of the membership function $mB_{22}$ are similar to those of the membership function $mB_{12}$, it can be seen that, contrary to the membership function $mB_{12}$, the degree at which the prerequisite $b_{22}$ is matched increases as the multipass amount detection value P increases.

(3) Membership Function $mP_{22}$ Providing Result:

A diagram (f) of FIG. 6 illustrates a membership function $mP_{22}$ which provides a result, that is, a controlling operation point.

While contents of the membership function $mP_{22}$ are similar to those of the membership function $mP_{12}$, it can be seen that, contrary to the membership function $mP_{12}$, the degree at which the result is matched increases as the controlling operation point V becomes higher.

(5) Fuzzy Inference Processing

In fuzzy inference processing executed by the fuzzy inference means 15, in the case of inference processing in accordance with the fuzzy production rule R12, a smaller one of values of the membership functions $mA_{12}$ and $mB_{12}$ corresponding to observed reception electric field strength value E and multipath amount detection value P, that is, the value $v_{12}$ of the membership function $mB_{12}$, is adopted by the minimum value method.

Subsequently, a hatched region shown in the diagram (c) of FIG. 6 is determined as a result of inference in accordance with the fuzzy production rule R12 by the head cutting method of Yager.

Similarly, in accordance with the fuzzy production rule R22, in the case of the membership functions $mA_{22}$ and $mB_{22}$, a smaller one of the values, that is, the value $u_{22}$ of the membership function $mA_{22}$, is adopted by the minimum value method.

Subsequently, as a result of inference in accordance with the fuzzy production rule R22, a hatched region shown in the diagram (f) of FIG. 6 is obtained by the head cutting method of Yager.

Finally, the membership functions $mP_{12}$ and $mP_{22}$ (hatched regions) of a result of inference obtained in accordance with the fuzzy production rules R12 and R22 are overlapped with each other in accordance with the MAX composing method to compose a composite membership function $mP_2$ as shown in a diagram (g) of FIG. 6.

Subsequently, a coordinate value V on the axis of abscissa of the center of gravity of the composite membership function $mP_2$ is outputted as a final inference result, that is, a controlling operation starting point V.

Contents of the fuzzy inference processing of the second embodiment executed by the fuzzy inference means 15 described so far are similar to those of the fuzzy inference processing described hereinabove in the item (5) of the first embodiment except that the final inference result is a controlling operation starting point V, and accordingly, detailed description thereof will be omitted herein.

By the inference processing described so far, the final inference result, that is, the controlling operation starting point V, becomes higher as the reception electric field strength value E increases and the multipath amount detection value P decreases, that is, as the receiving condition becomes better, and on the contrary, as the reception electric field strength value E decreases and the multipath amount detection value P increases, that is, as the receiving condition becomes worse, the value of the controlling operation starting point V decreases.

(6) Fuzzy Controlling Operation

Figure 7:
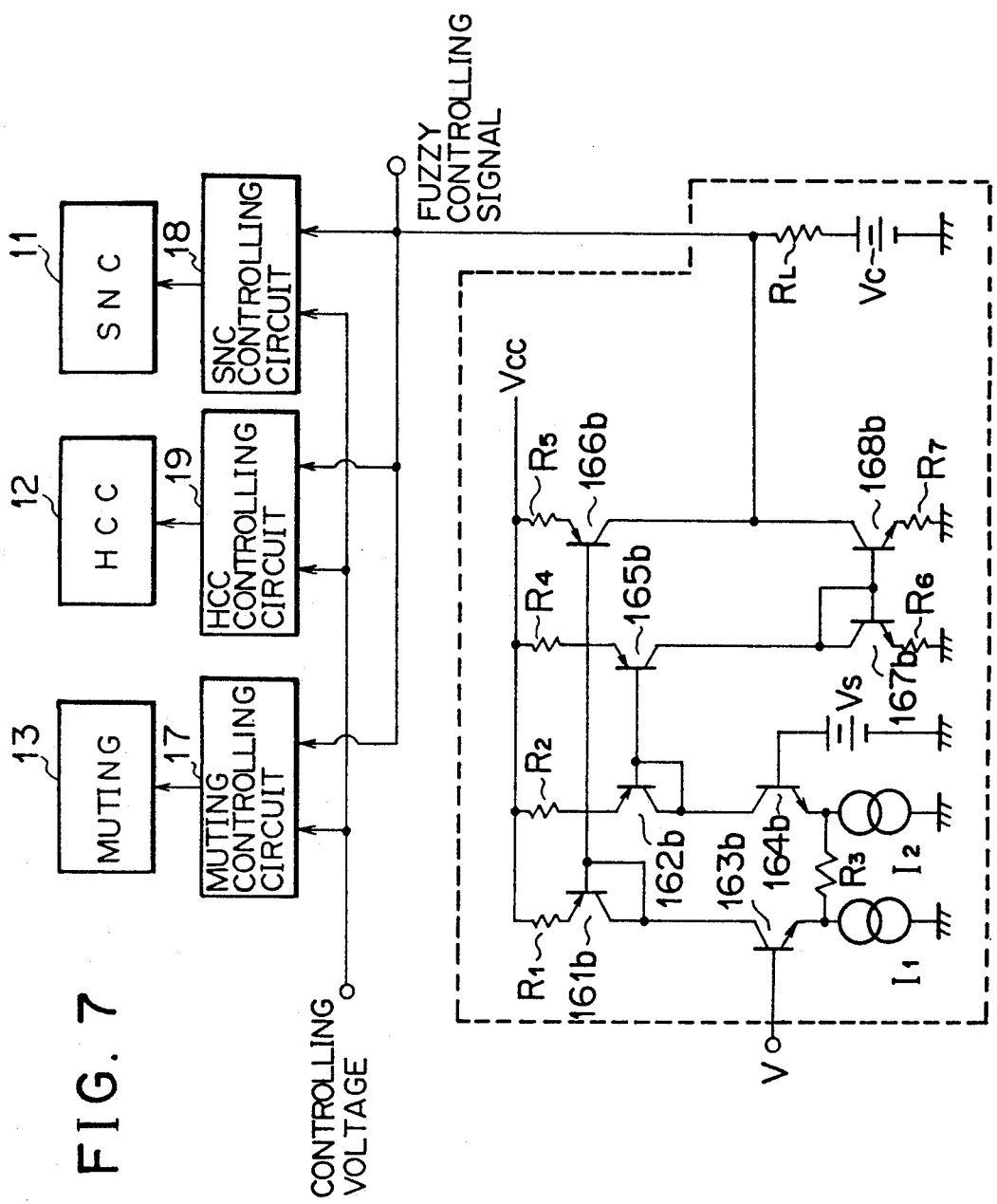
FIG. 7 is a circuit diagram of a fuzzy controlling signal generating circuit of the noise reducing circuit of the second embodiment.

A controlling signal generating circuit 16 employed in the noise reducing circuit of the second embodiment is shown in FIG. 7. Referring to FIG. 7, the noise reducing circuit shown includes four transistors 161b to 164b, resistors $R_1$ to $R_3$, a reference power source Vs, and constant current sources $I_1$ and $I_2$. A differential amplifier is constituted from those circuit elements.

The noise reducing circuit further includes transistors 165b to 168b and resistors $R_4$ to $R_7$ which constitute an amplifier circuit for an output of the differential amplifier.

An end of a load resistor RL is connected to a connecting point between the transistors 166b and 168b, and a controlling operation point voltage is outputted from the connecting point. The other end of the load resistor RL is connected to a power source Vc.

Such muting circuit 13, separation control circuit 11 and frequency characteristic control circuit 12 as described hereinabove with reference to FIG. 1 are connected to receive the controlling operation point voltage or fuzzy controlling signal from the controlling signal generating circuit 16.

In particular, the muting control circuit 13 is connected to the controlling signal generating circuit 16 by way of a muting controlling circuit 17 for controlling muting operation which is executed by the muting control circuit 16.

The separation control circuit 11 is connected to the controlling signal generating circuit 16 by way of a separation controlling circuit 18 for controlling separation control operation which is executed by the separation control circuit 11.

The frequency characteristic control circuit 12 is connected to the controlling signal generating circuit 16 by way of a frequency characteristic controlling circuit for controlling frequency characteristic controlling operation which is executed by the frequency characteristic control circuit 12.

Thus, a controlling operation starting point V determined by the fuzzy inference means 15 is inputted to the base of the transistor 163b which is one of the differential amplifier mentioned hereinabove.

Then, a differential output between the controlling operation starting point V and the reference voltage Vs is amplified by the amplifier circuit which is constituted from the transistors 165b to 168b and so forth as described hereinabove, and a controlling operation starting voltage is outputted as a fuzzy controlling signal.

Accordingly, since the controlling operation starting point V becomes higher as the reception electric field strength value E increases and the multipath amount detection value P decreases, that is, as the receiving condition becomes better, also the fuzzy controlling signal level becomes higher. On the contrary, since the value of the controlling operation starting point V becomes lower as the reception electric field strength value E decreases and the multipath amount detection value P increases, that is, as the receiving condition becomes worse, also the fuzzy controlling signal level becomes lower.

The fuzzy controlling signal (controlling operation starting voltage V) is supplied to the muting controlling circuit 17, separation controlling circuit 18 and frequency characteristic controlling circuit 19.

Meanwhile, an output of a reception electric field level detecting circuit not shown (which may be the level detecting circuit 31 of FIG. 10) is inputted as a controlling voltage to the muting controlling circuit 17, separation controlling circuit 18 and frequency characteristic controlling circuit 19.

The muting controlling circuit 17, separation controlling circuit 18 and frequency characteristic controlling circuit 19 start control for the respective control circuits 13, 11 and 12 with a controlling voltage when the controlling voltage level from the level detecting circuit exceeds the fuzzy controlling signal level (controlling operation starting voltage V) received from the controlling signal generating circuit 16.

Consequently, as the reception electric field strength value E increases and the multipath amount detection value P decreases, that is, as the receiving condition becomes better, the fuzzy controlling signal level (controlling operation starting point V) becomes higher, and controlling operations of the individual muting controlling circuit 17, separation controlling circuit 18 and frequency characteristic controlling circuit 19 are not influenced by a small variation of the receiving input condition and can maintain a good receiving condition since controlling operations of the individual control circuits are not started unless the controlling voltage level of them becomes higher the thus high fuzzy controlling signal level. In other words, when the receiving condition is good, the good receiving condition can be maintained if the individual control circuits do not operate very much.

On the contrary, as the reception electric field value E decreases and the multipath amount detection value P increases, that is, as the receiving condition becomes worse, the value of the controlling operation starting point V becomes lower, and controlling operations of the individual muting controlling circuit 17, separation controlling circuit 18 and frequency characteristic controlling circuit 19 can respond sufficiently to a small variation of the receiving input condition and maintain a good receiving condition since controlling operations of the individual control circuits are started even if the controlling voltage level thereof is low.

Third Embodiment

A third embodiment of the present embodiment will be described with reference to FIGS. 3, 8 and 9. Also a noise reducing circuit of the present embodiment employs the input vector generating circuit shown in FIG. 3 as an input vector generating circuit.

In the third embodiment described subsequently, the control parameter is either a controlling amount which defines a controlling range of any one of a muting control circuit, a separation control circuit and a frequency characteristic control circuit or a controlling amount for each of any combination of those circuits. Meanwhile, the number of factors of an input vector is two including a reception electric field strength value E and a multipath amount detection value P similarly as in the case of the first embodiment, and fuzzy production rules are two rules of R13 and R23.

(A) Generation of Input vector

Since construction of the input vector generating circuits 14a and 14b shown in FIGS. 3a and 3b, respectively, and operation of the input vector generating circuits 14a and 14b to generate a reception electric field strength value E and a multipath amount detection value P are described hereinabove, overlapping description thereof will be omitted to avoid redundancy.

(B) Fuzzy Inference Processing

Fuzzy inference processing executed by the fuzzy inference means 15 in the noise reducing circuit of the present embodiment will be described with reference to FIG. 8.

In the fuzzy inference processing, the following two fuzzy production rules R13 and R23 as well as membership functions which provide the individual fuzzy production rules R13 and R12 are set. Also here, the fuzzy production rules and membership functions are theoretically or experimentally set so that a good receiving condition may be obtained in accordance with a reception electric field strength value E and a multipath amount detection value P.

(1) Fuzzy Production Rule R13

(1) Prerequisite (IF):

$a_{13}$: A reception electric field level is high.

$b_{13}$: A multipath amount is small.

(2) Result (THEN):

A control amount is decreased.

(2) Membership Functions of Fuzzy Production Rule R13

Figure 8:
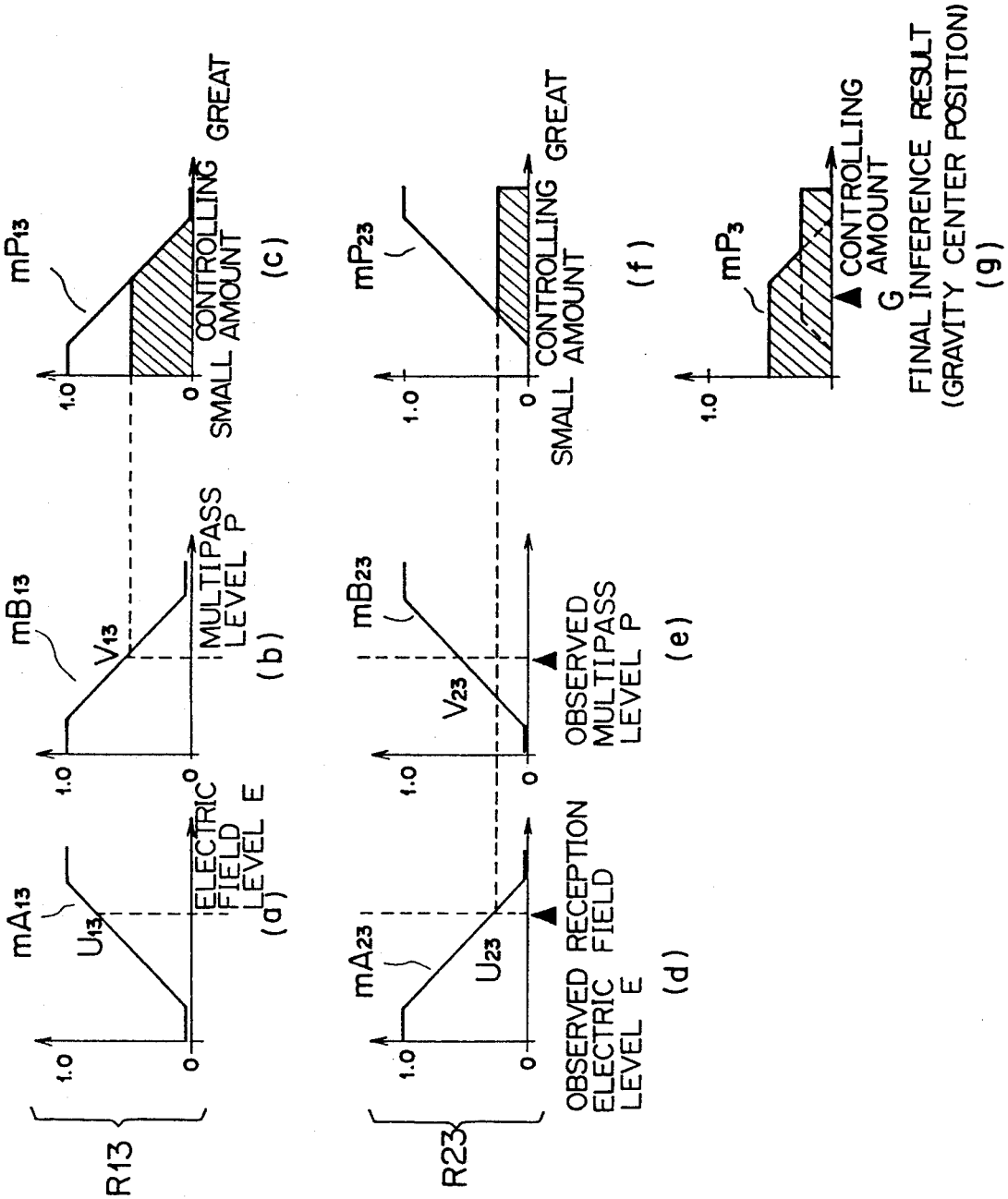
FIG. 8 shows a set of diagrams illustrating fuzzy inference processing of a noise reducing circuit according to a third embodiment of the present invention.

(1) Membership Function $mA_{13}$ of Prerequisite $a_{13}$:

A diagram (a) of FIG. 8 illustrates a membership function $mA_{13}$ which provides a prerequisite $a_{13}$, that is, probability of highness of a reception electric field level.

Contents of the membership function $mA_{13}$ are similar to those of the membership function $mA_{11}$ shown in the diagram (a) of FIG. 4, and it can be seen that the degree at which the prerequisite $a_{13}$ is matched increases as the reception electric field strength E increases.

(2) Membership Function $mB_{13}$ of Prerequisite $b_{13}$:

A diagram (b) of FIG. 8 illustrates a membership function $mB_{13}$ which provides a prerequisite $b_{13}$, that is, probability of smallness of a multipath amount.

Contents of the membership function $mB_{13}$ are similar to those of the membership function $mB_{11}$ shown in the diagram (b) of FIG. 4, and it can be seen that the degree at which the prerequisite $b_{13}$ is matched decreases as the multipath amount detection value P increases.

(3) Membership Function $mP_{13}$ Providing Result:

A diagram (c) of FIG. 8 illustrates a membership function $mP_{13}$ which provides a result, that is, a controlling operation point.

Contents of the membership function $mP_{13}$ are similar to those of the membership function $mP_{11}$ shown in the diagram (a) of FIG. 4, and it can be seen that the degree at which the result is matched decreases as the controlling amount G increases.

(3) Fuzzy Production Rule R23

(1) Prerequisite (IF):

$a_{23}$: A reception electric field level is low.

$b_{23}$: A multipath amount is great.

(2) Result (THEN):

A controlling amount is increased.

(4) Membership Functions of Fuzzy Production Rule R23

(1) Membership Function $mA_{23}$ of Prerequisite $a_{23}$:

A diagram (d) of FIG. 8 illustrates a membership function $mA_{23}$ which provides a prerequisite $a_{23}$, that is, probability of lowness of a reception electric field level.

While contents of the membership function $mA_{23}$ are similar to those of the membership function $mA_{13}$, it can be seen that, contrary to the membership function $mA_{13}$, the degree at which the prerequisite $a_{23}$ is matched decreases as the reception electric field strength E increases.

(2) Membership Function $mB_{23}$ of Prerequisite $b_{23}$:

A diagram (e) of FIG. 8 illustrates a membership function $mB_{23}$ which provides a prerequisite $b_{23}$, that is, probability of greatness of a multipath amount.

While contents of the membership function $mB_{23}$ are similar to those of the membership function $mB_{13}$, it can be seen that, contrary to the membership function $mB_{13}$, the degree at which the prerequisite $b_{23}$ is matched increases as the multipath amount detection value P increases.

(3) Membership Function $mP_{23}$ Providing Result:

A diagram (f) of FIG. 8 illustrates a membership function $mP_3$ which provides a result, that is, a controlling amount G.

While contents of the membership function $mP_{23}$ are similar to those of the membership function $mP_{13}$, it can be seen that, contrary to the membership function $mP_{13}$, the degree at which the result is matched increases as the controlling amount G increases.

(5) Fuzzy Inference Processing

In fuzzy inference processing executed by the fuzzy inference means 15, as for the fuzzy production rule R13, the relationship between the membership functions $mA_{13}$ and $mB_{13}$ is such that a smaller one of them, that is, the value $v_{13}$ of the membership function $mB_{13}$, is adopted by the minimum value method. Subsequently, a hatched region shown in the diagram (c) of FIG. 8 is determined as a result of inference in accordance with the fuzzy production rules R13 by the head cutting method of Yager.

Similarly, as for the fuzzy production rule R23, the relationship between the membership functions $mA_{23}$ and $mB_{23}$ is such that a smaller one of them, that is, the value $u_{23}$ of the membership function $mA_{23}$, is adopted by the minimum value method. Subsequently, as a result of inference in accordance with the fuzzy production rule R23, a hatched region shown in the diagram (f) of FIG. 8 is obtained by the head cutting method of Yager.

Finally, the membership functions $mP_{13}$ and $mP_{23}$ (hatched regions) of a result of inference obtained in accordance with the fuzzy production rules R13 and R23 are overlapped with each other in accordance with the MAX composing method to compose a composite membership function $mP_3$ as shown in a diagram (g) of FIG. 8.

Subsequently, a coordinate value G on the axis of abscissa of the center of gravity of the composite membership function $mP_3$ is outputted as a final inference result, that is, a controlling amount G.

Contents of the fuzzy inference processing in the third embodiment executed by the fuzzy inference means 15 described so far are similar to those of the fuzzy inference processing described hereinabove in the item (5) of the first embodiment except that the final inference result is a controlling amount G, and accordingly, detailed description thereof will be omitted herein.

By the inference processing described so far, the final inference result, that is, the value of the controlling amount G, becomes smaller as the observed reception electric field strength value E increases and the multipath amount detection value P decreases, that is, as the receiving condition becomes better, and on the contrary, as the reception electric field strength value E decreases and the multipath amount detection value P increases, that is, as the receiving condition becomes worse, the value of the controlling amount G increases.

(6) Fuzzy Controlling Operation

Figure 9:
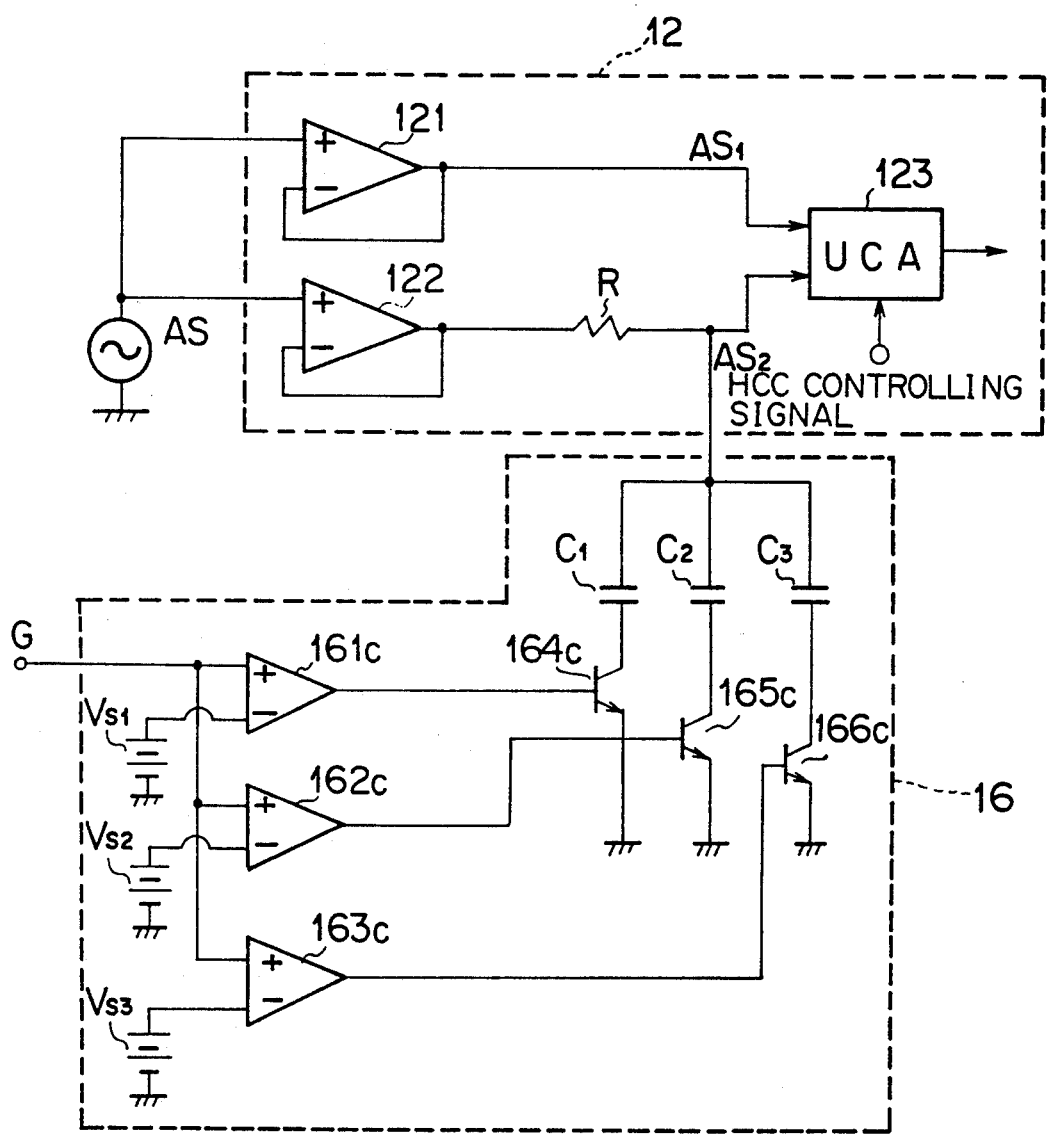
FIG. 9 is a circuit diagram of a fuzzy controlling signal generating circuit of the noise reducing circuit of the third embodiment.

A fuzzy controlling signal generating circuit 16 which is employed in the noise reducing circuit of the third embodiment is shown in FIG. 9 in which a frequency characteristic control circuit 12 for a channel of demodulated audio signals is also shown. It is to be noted that a control amount of the frequency characteristic control circuit 12 is controlled by a fuzzy controlling signal generated by the fuzzy controlling sing generating circuit 16.

Referring to FIG. 9, the fuzzy controlling signal generating circuit 16 includes three comparators 161c, 162c and 163c for comparing an inputted controlling amount G with reference voltages $V_{S1}$, $V_{S2}$ and $V_{S3}$, respectively. The relationship in magnitude of the reference voltages $V_{S1}$ to $V_{S3}$ is set as $V_{S1} < V_{S2} < V_{S3}$.

Switching transistors 164c, 165c and 166c are connected to the comparators 161c to 163c such that they are each turned on into a conducting state when a corresponding one of the comparators 161c to 163c generates an output.

Capacitors $C_1$, $C_2$ and $C_3$ for the adjustment of controlling ranges are connected at one ends thereof connected to the collectors of the switching transistors 164c to 166c, respectively, while the other ends thereof are connected commonly to a resistor R for the adjustment of a controlling range included in the frequency characteristic control circuit 12. The relationship in magnitude of the capacitors $C_1$ to $C_3$ is set as $C_1 < C_2 < C_3$. Time constants for the adjustment of controlling ranges are individually set by the resistor R and capacitors $C_1$ to $C_3$.

The frequency characteristic control circuit 12 further includes a pair of buffers 121 and 122 for an inputted audio signal AS. An output of the buffer 121, that is, an audio signal $AS_1$, is supplied directly to one of a pair of input terminals of a variable controlling amplifier (VCA) 123 while an output of the other buffer 122, that is another audio signal $AS_2$, is supplied to the other input terminal of the variable controlling amplifier 123 by way of the resistor R for the adjustment of a high frequency region characteristic.

Meanwhile, an HCC controlling signal for the adjustment of a high frequency region characteristic is inputted to the variable controlling amplifier 123 from a reception input level detecting circuit not shown which may be, for example, the level setting circuit 33 and the time constant circuit 36 of FIG. 10. Consequently, a mixing amount of audio signals AS from the buffer 121 and resistor R is controlled so that frequency characteristic control of an addition signal is executed.

With the construction, while a controlling amount G is inputted from the fuzzy inference means 15 to the comparators 161c to 163c of the fuzzy controlling signal generating circuit 16, the value of the controlling amount G decreases as the observed reception electric field value E increases and the multipath amount detection value P decreases, that is, as the receiving condition becomes better, but on the contrary, as the reception electric field strength value E decreases and the multipath amount detection value P increases, that is, as the receiving condition becomes worse, the value of the controlling amount G increases.

In this manner, as the receiving condition becomes worse and the level of the controlling amount G increases, the comparators 161c, 162c and 163c successively generate an output so that the switching transistors 164c, 165c and 166c are successively put into a conducting state and the time constant for the adjustment of a controlling range increases from $RC_1$ to $R(C_1 + C_2)$ and further to $R(C_1 + C_2 + C_3)$.

As a result, the high frequency region characteristic of the audio signal $AS_2$ inputted from the buffer 122 to the variable controlling amplifier 123 by way of the resistor R drops as the receiving condition becomes worse and the level of the controlling amount G increases, and the amount of such drop increases in proportion to the level of the controlling amount G.

When an HCC controlling signal for the adjustment of a high frequency characteristic is inputted to the variable controlling amplifier 123, frequency characteristic control is executed by controlling the mixing amount of the audio signals $AS_1$ and $AS_2$ from the buffer 21 and resistor R.

In particular, as the HCC controlling signal level becomes higher (the receiving condition becomes better), the mixing amount of the audio signal $AS_2$ with the audio signal $AS_1$ decreases, and an audio signal wherein no drop is involved in high frequency characteristic is outputted.

On the contrary, as the HCC controlling signal level becomes lower (the receiving condition becomes worse), the mixing amount of the audio signal $AS_2$ with the audio signal $AS_1$ increases, and when it is at the greatest, an audio signal wherein the high frequency characteristic drops to the characteristic of the audio signal $AS_2$ is outputted.

The controlling range of the high frequency characteristic in this instance is determined by a time constant of a fuzzy controlling signal, that is, a level of a controlling amount G and increases in proportion to the level of the controlling amount G. Accordingly, the frequency characteristic control range increases in proportion to the level of the controlling amount G.

As described so far, since the fuzzy controlling signal level or controlling amount G decreases and also the controlling amount of the frequency characteristic control circuit 12 decreases as the reception electric field strength value E increases and the multipath amount detection value P decreases, that is, as the receiving condition becomes better, the frequency characteristic of a demodulated audio signal does not drop and a good receiving condition can be maintained. In particular, when the receiving condition is good, the good receiving condition can be maintained if the frequency characteristic control range of the frequency characteristic control circuit 12 is small.

On the contrary, since the controlling amount G increases and the frequency characteristic control range of the frequency characteristic control circuit 12 increases as the reception electric field strength value E decreases and the multipath amount detection value P increases, that is, as the receiving condition becomes worse, even when the receiving input condition is such that noises are included and the S/N ratio is low, the noises are reduced and the S/N ratio is improved so that a good receiving condition can be assured and an erroneous operation can be prevented.

The foregoing description of fuzzy controlling operation of the frequency characteristic control circuit similarly applies to fuzzy controlling operation of the other separation control circuit and muting control circuit.

While the individual embodiments of the present invention are described so far, the present invention is not limited to the embodiments. For example, an input vector may include a plurality of factors other than those two described above which include a reception electric field strength and a multipath amount.

Meanwhile, characteristics of individual fuzzy production rules and individual membership functions which provide those production rules are not limited to those of the characteristics of the individual embodiments.

Further, the technique of obtaining a final result of inference, that is, an operation sensitivity point SE in accordance with results of inference based on individual membership functions which provide precedent portions of the individual fuzzy production rules may be any one of various known techniques such as a MAX-MIN method other than the method of elastic center which has been made clear with the embodiments.

Having now fully described the invention, it will be apparent to one of ordinary skill in the art that many changes and modifications can be made thereto without departing from the spirit and scope of the invention as set forth herein.

What is claimed is:

1. A noise reducing apparatus for a receiver, comprising:
    receiving means for receiving a signal;
    level detecting means for detecting a reception electric field strength of a received signal which indicates a receiving condition of said receiver;
    signal processing means for generating a high quality output signal with reduced noise;
    an input vector generating circuit for generating an input vector in response to a signal output by said level detecting means, said input vector representing values of respective reception factors;
    fuzzy inference means for fuzzy inferring, using the input vector received from said input vector generating circuit as a prerequisite, in accordance with fuzzy production rules provided by membership functions of the respective reception factors of the input vector, said fuzzy inference means generating an inference result based upon said fuzzy inferring; and
    a fuzzy controlling signal generating circuit for generating a fuzzy controlling signal based upon said inference result received from said fuzzy inference means for controlling a control parameter of said signal processing means, said control parameter being varied in response to said reception condition of said receiver as determined from said level detecting means and said input vector generating means to reduce the noise in an output signal of said receiver.

2. A noise reducing apparatus as claimed in claim 1, wherein the respective reception factors of the input vector include a reception electric field strength value and a multipath amount detection value.

3. A noise reducing apparatus as claimed in claim 2, wherein said signal processing means includes at least one of a frequency characteristic control circuit, a separation control circuit, and a muting control circuit.

4. A noise reducing apparatus as claimed in claim 3, wherein the control parameter to be controlled in accordance with the result of inference of said fuzzy inference means is a controlling time constant of each of said frequency characteristic control circuit, separation control circuit and said muting control circuit.

5. A noise reducing apparatus as claimed in claim 3, wherein the control parameter to be controlled in accordance with the result of inference of said fuzzy inference means is a controlling operation starting point of each of said frequency characteristic control circuit, separation control circuit and muting control circuit.

6. A noise reducing circuit as claimed in claim 2, wherein the control object amount to be controlled in accordance with the result of inference of said fuzzy inference means is a controlling amount defining a controlling range of each of said frequency characteristic control circuit, separation control circuit and muting control circuit.

7. A noise reducing apparatus as claimed in any one of claims 4 to 6, wherein the multipath amount detection value is an ac component existing in the reception electric field strength signal.

8. A noise reducing apparatus as claimed in any one of claims 4 to 6, wherein said multipath amount detection value is a noise component existing in an output of said receiving means.

* * * * *